(12) United States Patent
Grundon et al.

(10) Patent No.: US 6,510,100 B2
(45) Date of Patent: Jan. 21, 2003

(54) SYNCHRONOUS MEMORY MODULES AND MEMORY SYSTEMS WITH SELECTABLE CLOCK TERMINATION

(75) Inventors: Steven Grundon, Jericho, VT (US); Mark Kellogg, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/729,013

(22) Filed: Dec. 4, 2000

(65) Prior Publication Data
US 2002/0067654 A1 Jun. 6, 2002

(51) Int. Cl.[7] .................................. G11C 8/00
(52) U.S. Cl. ........................ 365/233; 365/204
(58) Field of Search ................. 365/233, 185.2, 365/185.21, 189.01, 201, 203, 204, 210; 711/170

(56) References Cited

U.S. PATENT DOCUMENTS

| | | |
|---|---|---|
| 5,081,374 A | 1/1992 | Davis |
| 5,204,554 A | 4/1993 | Ohannes et al. |
| 5,537,352 A | 7/1996 | Meyer et al. |
| 5,687,330 A * | 11/1997 | Gist et al. .................. 326/30 |
| 5,781,028 A * | 7/1998 | Decuir ....................... 326/21 |
| 5,826,001 A | 10/1998 | Lubbers et al. |
| 5,870,573 A | 2/1999 | Johnson |
| 5,896,346 A | 4/1999 | Dell et al. |
| 5,966,054 A | 10/1999 | May et al. |
| 5,973,552 A | 10/1999 | Allan |
| 6,043,694 A | 3/2000 | Dortu |
| 6,047,343 A | 4/2000 | Olarig |
| 6,055,633 A | 4/2000 | Schrier |
| 6,081,862 A | 6/2000 | Dixon |
| 6,088,291 A | 7/2000 | Fujioka |
| 6,090,150 A | 7/2000 | Tawada |
| 6,115,278 A | 9/2000 | Deneroff |

OTHER PUBLICATIONS

Desi Rhoden, Standard DRAM futures and DDR infrastructures, Advanced Memory International, Inc., Jul. 21–22, 1999.

John M. Smolka, Texas Instruments, Mar., 2000, Standard for definition of CDCV857 PLL clock driverfor registered DDR DIMM applications.

Stephen M. Nolan, Texas Instruments, Apr. 2000, Standard for definition of 74SSTV16859 13–bit to 26–bit sstl 2 registered buffer for stacked DDR dimm applications.

* cited by examiner

Primary Examiner—A. Zarabian
(74) Attorney, Agent, or Firm—Steven Capella; Daryl K. Neff

(57) ABSTRACT

The invention encompasses memory systems and/or memory modules which allow selectable clock termination between the clock/clock buffer and components of the memory modules. The invention provides a fully forward and backward compatible memory solution. The invention provides the memory modules themselves, the FET switches designed for use on the modules, and the systems that include enable/disable pins to use these modules. This invention will permit memory modules to be developed that can operate in existing (emerging) memory subsystems, as well as meet the low power/low pin count needs of future memory subsystems with no required changes to the existing/emerging systems. For 184 Pin Registered DIMMs, the power savings will equate to greater than 200 mw/DIMM, and systems will be permitted to connect DIMM clocks in serial, similar to address/control lines, thereby increasing the address/control window as well as the system read loop-back timings.

32 Claims, 4 Drawing Sheets

SYNCHRONOUS MEMORY MODULES AND MEMORY SYSTEMS WITH SELECTABLE CLOCK TERMINATION

BACKGROUND OF THE INVENTION

In memory systems and microelectronics in general, there is a desire for performance, power conservation and component compatibility. These issues are especially important where design advances (both in memory technology and computing technology) are occurring at very rapid pace by mobile applications, high-powered applications, etc. (e.g., PC's, mobile systems, printers, RAID applications).

In recent years, the need for improved memory system speed/performance has driven the development of synchronous SRAM and synchronous dynamic random access memory (SDRAM). Even more recently, so-called double-data-rate (DDR) SDRAM memory modules have been proposed and developed. The DDR-SDRAM effectively doubles the data throughput at a given system clock speed. These types of advances are expected to continue with the introduction higher clock speed versions of DDR-SDRAM (e.g., 166 MHz clock speed or greater). Discussions of SDRAM and DDR-SDRAM can be found in JEDEC standards publications. Another reference covering the background of this technology is the book, "High Performance Memories," by Betty Prince, published by Wiley & Sons, (1999).

A main feature of synchronous memory systems is the presence of a clock or clock buffer source in direct communication with the individual memory module(s) of the memory system. Aspects of such systems are disclosed in US Pat. Nos. 5,896,346; 6,043,694; and 6,081,862; the disclosures of which is incorporated herein by reference. Other aspects are discussed in U.S. patent application Ser. No. 09/240,647, filed Jan. 29,1999, now U.S. Pat. No. 5,347,367, the disclosure of which is incorporated herein by reference.

DDR memory modules, such as 184 Pin DIMMs (dual-in-line memory modules) and 200 Pin SO DIMMs, currently include a differential clock termination scheme which is proving to be non-optimal in low power and low pin count (controller) applications. In addition, the emergence of improved clock drivers and broad adoption of registered DIMMs (with onboard clock regeneration) have created new system clocking opportunities that could improve overall system timing budgets if alternate module/system clock termination solutions were permitted. Unfortunately, the need for backward compatibility between emerging memory modules and current designs limit the ability of producers to develop new/unique modules that service these new opportunities, unless some means of maintaining backward compatibility is maintained.

Thus, there is a need for a way of maintaining compatibility between memory modules in the same memory system, and in particular, for memory systems containing both SDRAM DIMMs and DDR-SDRAM DIMMs. There is also an need for designs/methods of improving clock signal management flexibility.

SUMMARY OF THE INVENTION

The invention encompasses memory systems and/or memory modules which allow selectable clock termination between the clock/clock buffer and the memory modules. The invention provides a fully forward and backward compatible memory solution. The invention provides the memory modules themselves, and the systems that include enable/disable pin(s) to use these modules.

In one aspect the invention encompasses a memory assembly with a selectable termination of the system-level clock. The selectable clock termination may be located at any desired point(s) in the clock net (e.g., at or near an end of a clock net, a split point of a clock net, etc.). The selectability is preferably provided by one or more switches for enabling and/or disabling the clock termination. The switch(es) is preferably a FET switch connected to a pin on the memory assembly. The memory assembly preferably permits operation in systems having both single drop end-terminated clock nets and systems having multi-drop clock nets wherein clock termination method is preferably selected from the group consisting of (i) single end termination, (ii) source series termination, and (iii) source capacitive termination.

The invention also encompasses memory systems, especially synchronous memory systems capable of utilizing memory assemblies having selectable clock termination.

The invention also encompasses a memory controller that includes detection circuitry to determine the type of memory clock termination utilized, whereby the clock drive is adjusted to match the termination method. The invention further encompasses a memory system that includes such memory controller in combination with a memory assembly with a selectable system-level clock termination.

The invention further encompasses a memory module that includes more than one clock termination method, whereby the clock termination permits a multitude of memory assemblies to share a common clock pair or to operate with unique clock pairs to each memory assembly. The clock termination method is preferably selectable via a control signal (e.g., $V_{dd}$, $V_{ddQ}$ or ground pin on the memory assembly) to the memory assembly. The memory module is preferably a DDR memory module, more preferably a 168–200 pin DIMM.

The invention also encompasses a memory subsystem that includes more than one clock termination method, whereby the clock termination permits a multitude of memory assemblies to share a common clock pair or to operate with unique clock pairs to each memory assembly. Preferably, a FET switch is integrated into a clock net of the subsystem to enable or disable clock termination on the memory assembly. The memory subsystem preferably includes the ability to have one or more clocks disabled via a FET switch which is integrated into a clock path.

These and other aspects of the invention are described in further detail below.

DETAILED DESCRIPTION OF THE INVENTION

The invention encompasses memory systems and/or memory modules which allow selectable clock termination between the clock/clock buffer and the memory modules. The invention provides the memory modules themselves, the memory systems that include enable/disable pins to use these modules, memory controllers that include circuitry for driving selection of the clock termination state as well as other aspects derived from the presence of the selectable clock termination capability provided by the invention.

Figure 1:
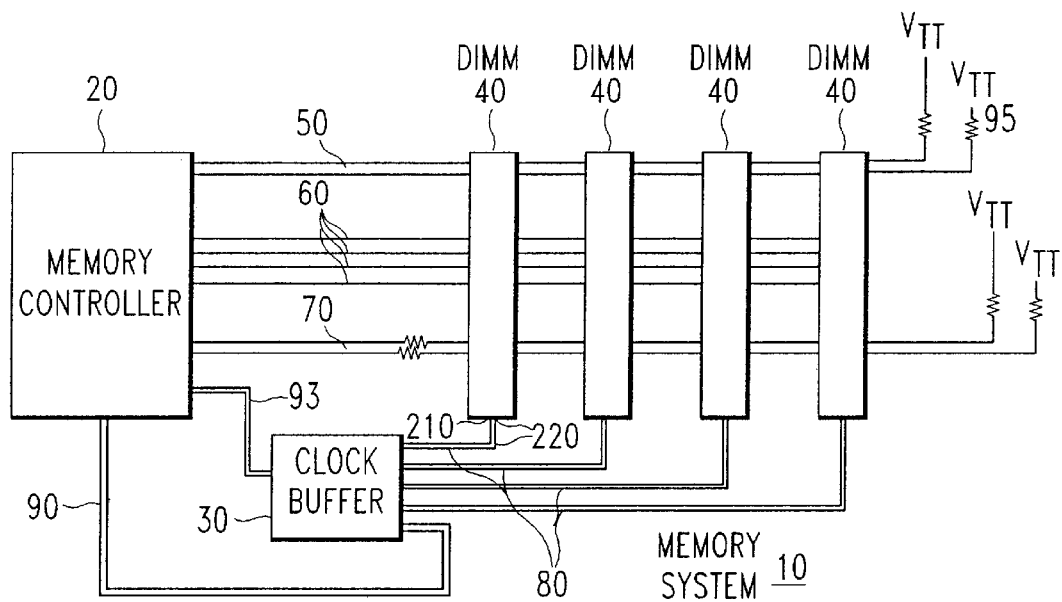
FIG. 1 is a schematic layout of a memory system using registered DIMMs.

Referring to the drawings, FIG. 1 shows a schematic layout of a memory system 10 using registered DIMMs 40. The DIMMs 40 are driven by clock buffer 30 and memory controller 20. Memory 20 communicates with DIMMs 40 through address bus 50, control bus 60, and data bus 70. It should be understood that the actually wiring of the various buses is grossly simplified in the drawings (i.e., not all the physical wiring is shown) for ease of illustration. Terminations ($V_{TT}$) 95 for address bus 50 and data bus 70 are also shown. Clock out lines 93 and feedback lines 90 connect clock buffer 30 with drive circuits (not shown) contained in controller 20. The clock drive to the DIMMs 40 is through clock lines 80. The clock signals are provided as a differential voltages. Thus, each DIMM has a clock 210 and clock-bar 220 connection.

Figure 3:
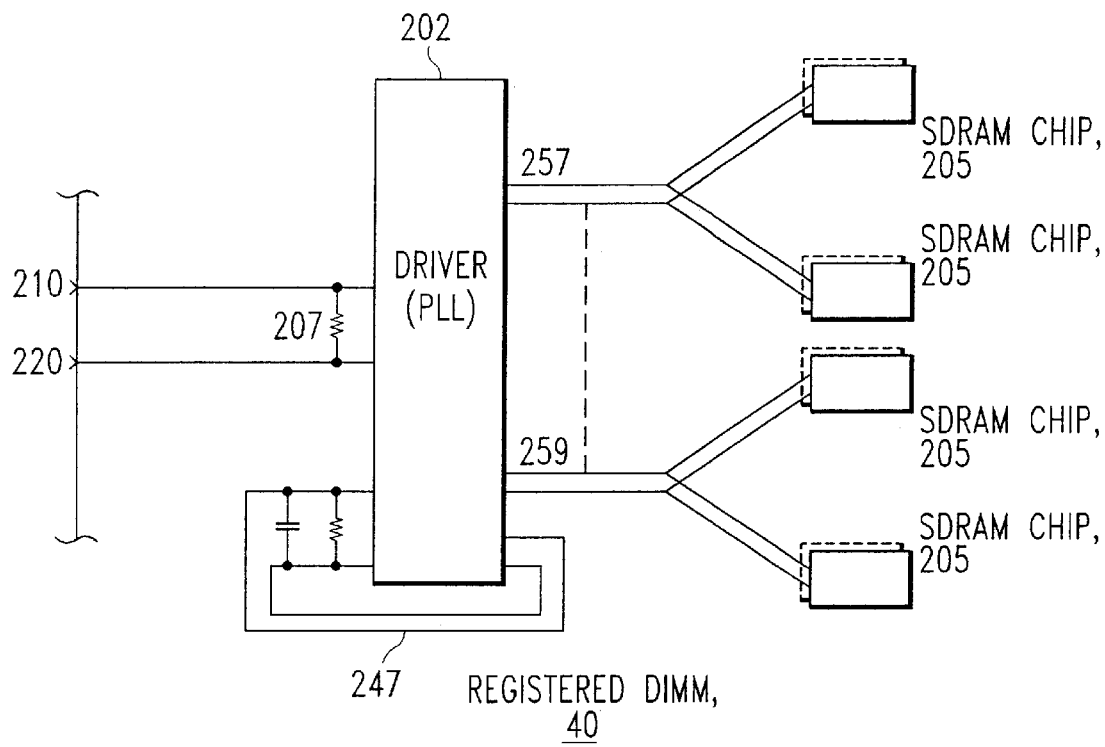
FIG. 3 is a schematic layout of the clock signal wiring (net) for a 184 pin registered DDR DIMM usable in the memory system of FIG. 1.

FIG. 3 shows a schematic layout of the clock net for a DIMM 40 of FIG. 1. In the registered DIMM, the clock signal 210/220 is terminated by resistor 207 at the connection with driver (PLL) 202. Driver 202 has a feedback loop 247 and drives clock signals 257 and 259 to respective SDRAM chips 205. Driver 202 would also drive clock signals to registers (not shown). It should be understood that many clock signal lines may emanate from PLL 202 in proportion to the number and sophistication of the SDRAM chips. The dotted lines at chips 205 indicate additional chips which may be present on the opposite side of the DIMM.

Figure 2:
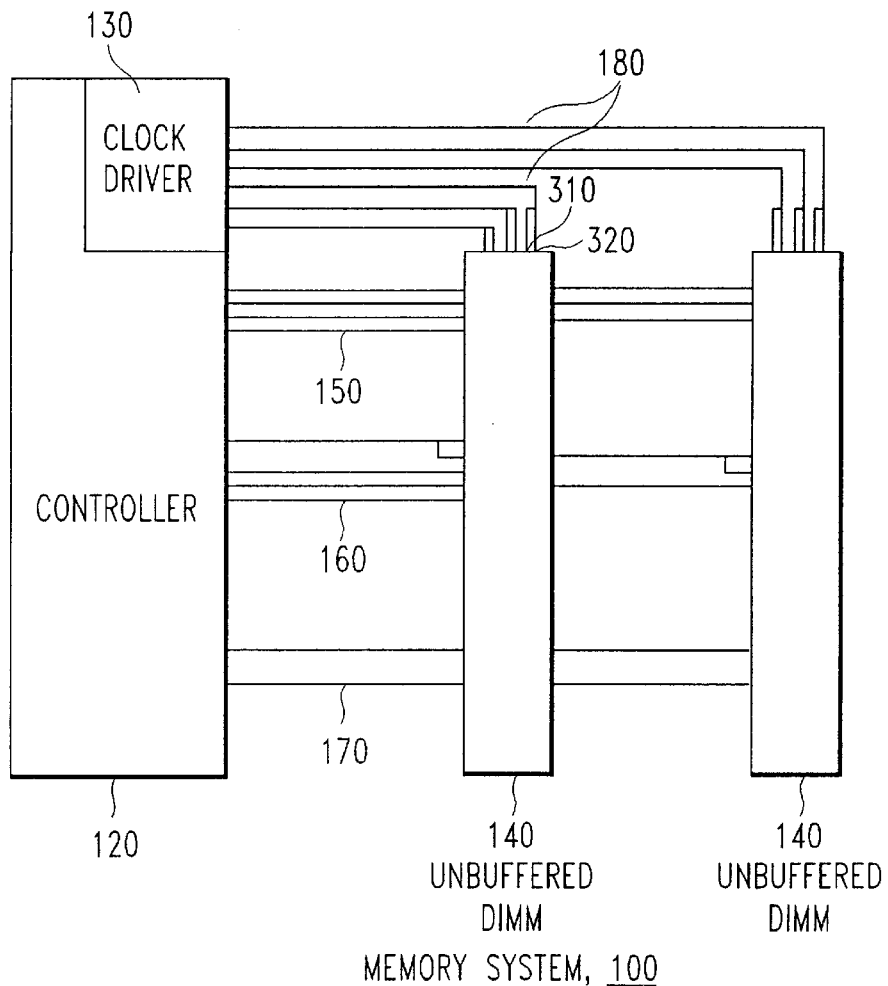
FIG. 2 is a schematic layout of a memory system using unbuffered DIMMs.

FIG. 2 is a schematic layout of a memory system 100 using unbuffered DIMMs 140. The address bus 150, control bus 160 and data bus 170 are shown in simplified form between the memory controller 120 and the DIMMs 140. The clock driver 130 is shown internal to controller 120. The clock driver 130 communicates with DIMMs 140 through clock differential lines 180 with only one of the clock 310 and clock-bar 320 connection enumerated for ease of illustration.

Figure 4:
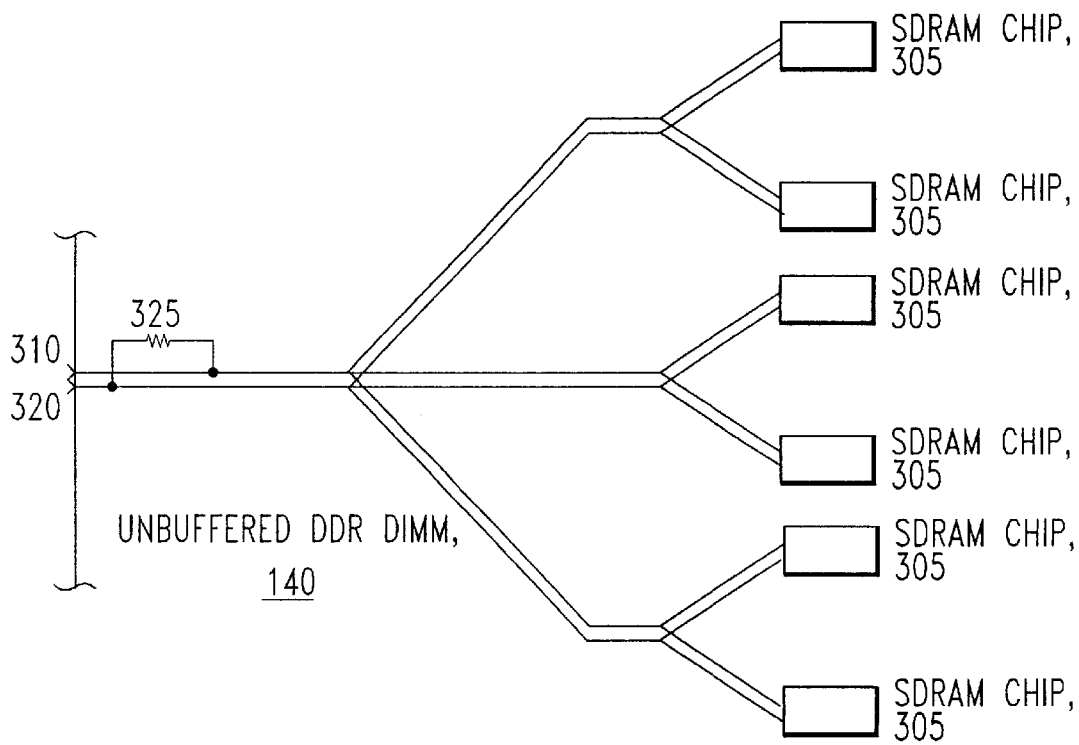
FIG. 4 is a schematic layout of the clock signal wiring (net) for a 184 pin unbuffered DDR DIMM usable in the memory system of FIG. 2.

FIG. 4 is a schematic layout of the clock signal wiring (net) for a 184 pin unbuffered DDR DIMM 140 usable in memory system 100 of FIG. 2. The clock 310 and clock-bar 320 lines are terminated by resistor 325. While FIG. 4 shown split of the clock net lines to drive several SDRAM chips 305, it should be understood that the configuration could also be constructed with dedicated clock signal input for each SDRAM, for smaller groups of SDRAM chips or for larger groups of SDRAM chips. Each clock/clock-bar pair would still have a termination resistor (or other termination elements).

Figure 5:
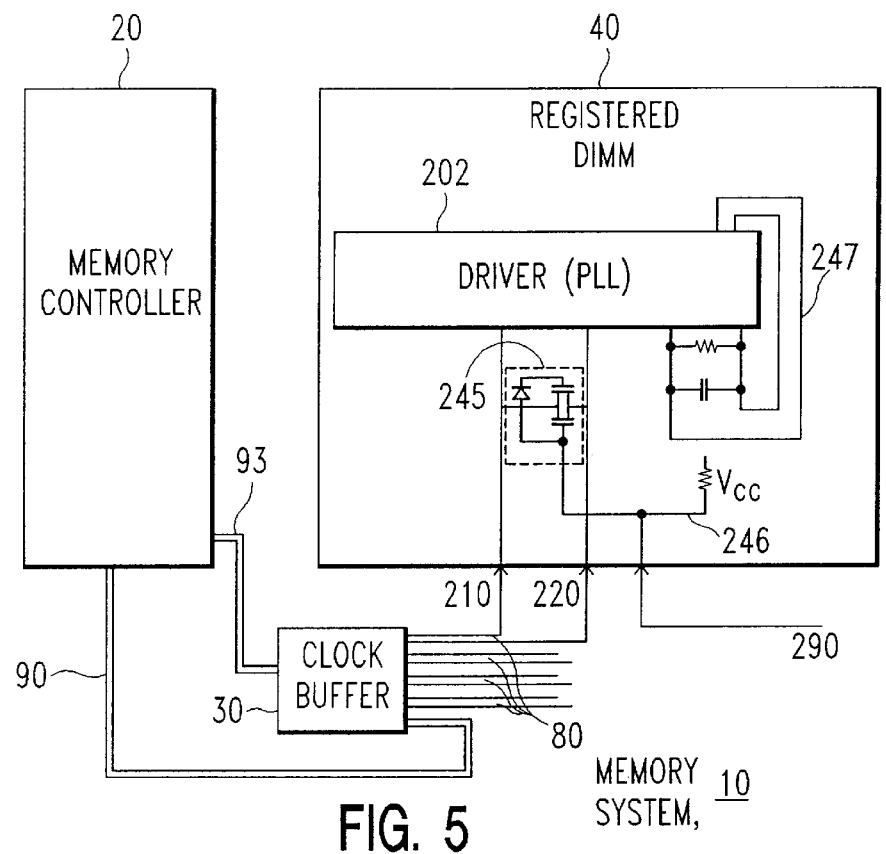
FIG. 5 is a schematic layout of an embodiment of the invention where the layout of the registered DIMM of FIG. 3 has been modified to add selectable clock termination with DIMM-driven default clock termination state.

FIG. 5 is a schematic layout of an embodiment of the invention where the layout of the registered DIMM of FIG. 3 has been modified to add selectable clock termination shown as an FET switch 245 which includes an inverter, P-FET and N-FET. The gate of the N-FET is connect in parallel to a default driver 246 which is a connection to DIMM power supply $V_{cc}$ through a resistor. The value of the resistor may be selected as appropriate for the switch specifications. The default driver preferably acts to maintain the switch in the "on" position such that termination of the clock is achieved through FET switch 245. If the resistive load of FET switch 245 is inadequate by itself for the desired termination, additional resistive load(s) (not shown) can be incorporated in series with FET switch 245 between the differential clock line pair.

Figure 6:
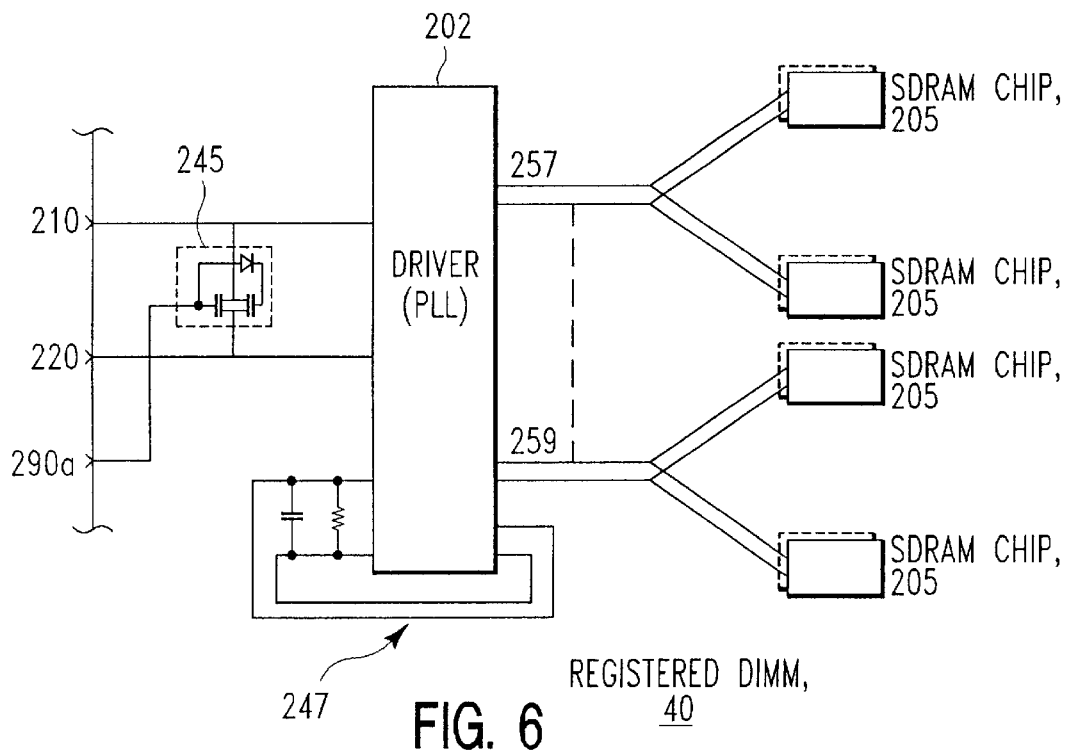
FIG. 6 is a schematic layout of an embodiment of the invention where the layout of the registered DIMM of FIG. 3 has been modified to add selectable clock termination driven by the memory system.

The default state of switch 245 can be overridden by input 290 from memory system 10. Preferably, input 290 is connected to an unused pin of the DIMM, for example in a 184 pin DIMM, pins such as numbers 9, 101,102 or 173. The input 290 may also include pullup or pulldown transistor configurations for controlling the input to switch 245. FIG. 6 shows a similar configuration as in FIG. 5 except that there is no on-DIMM default driver. In this case, the switch state would be controlled through input 290a from the memory system. In the case of FIG. 6, it is highly preferred to avoid a no-connect at input 290a such as would cause switch 245 to float.

Figure 7:
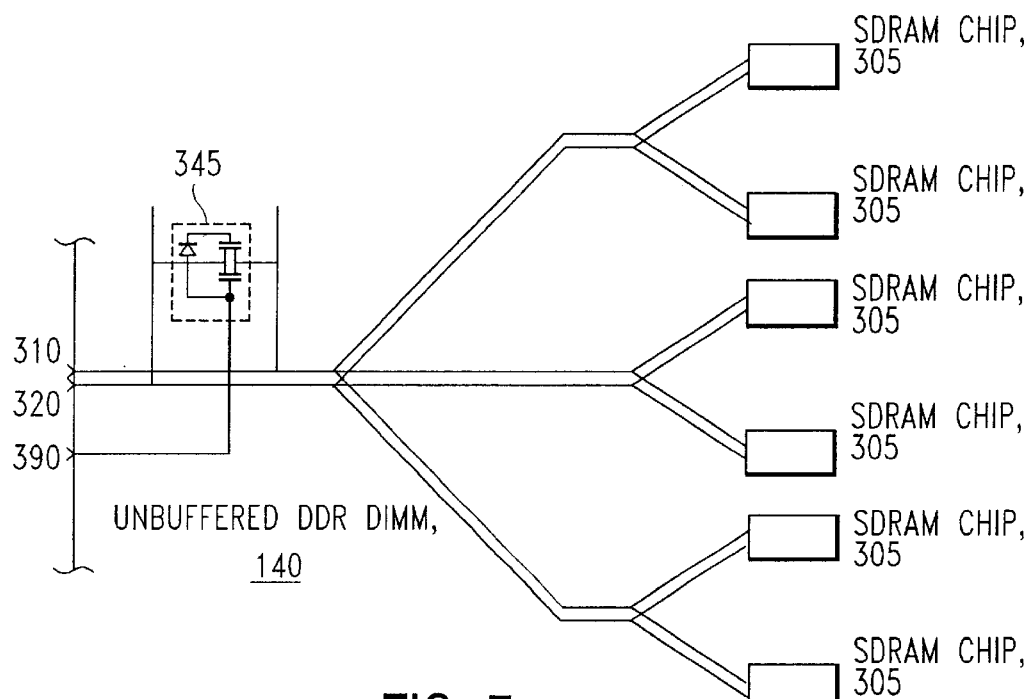
FIG. 7 is a schematic layout of an embodiment of the invention where the layout of the unbuffered DIMM of FIG. 4 has been modified to add selectable clock termination driven by the memory system.

FIG. 7 shows an implementation of the invention for an unbuffered DIMM. In this case, the FET switch 345 is used as the selectable termination. The control for switch 345 is through input 390 from the memory system. Where a single termination is used, as in FIG. 7, it is preferably located near the input location of the clock on the DIMM.

Figure 8:
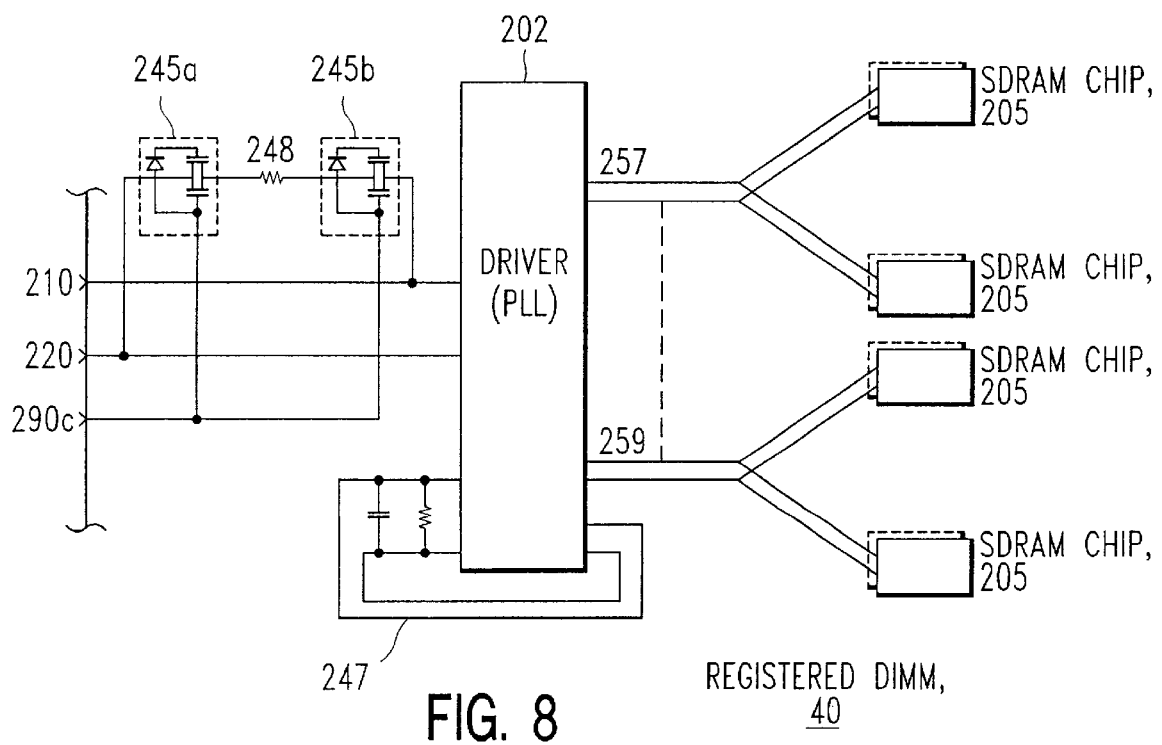
FIG. 8 is a schematic layout of an embodiment of the invention where the layout of the registered DIMM of FIG. 3 has been modified to add selectable clock terminations at multiple points in the clock net to reduce stub length.

FIG. 8 shows a further variation where multiple terminations 245a and 245b in combination with resistor 248 are used to terminate different locations in the clock net. This configuration or other multiple location termination configurations are preferable where stub lengths are of concern. It should be noted that the selectable clock termination may be located at any desired point(s) in the clock net (e.g., at or near an end of a clock net, a split point of a clock net, etc.). If desired, multiple switches, other switch designs, and/or terminations different termination modes may be included. The memory assembly preferably permits operation in systems having both single drop end-terminated clock nets and systems having multi-drop clock nets. The clock termination method may be selected from any known suitable method for the module design. The clock termination method is preferably selected from the group consisting of (i) single end termination, (ii) source series termination, and (iii) source capacitive termination. It may also be possible to have configurations where multiple termination modes are selectable on the same DIMM (or other memory module).

An alternate embodiment of the invention would include the elimination of the series or parallel termination and the addition of a single end terminator (beyond the final DIMM in the bank).

With the termination selectability, the memory controller preferably includes detection circuitry to determine the type of memory clock termination utilized, whereby the clock drive is adjusted to match the termination method. Such detection circuitry may be similar to that described in U.S.

patent application Ser. No. 09/240,647 mentioned above. The clock termination permits a multitude of memory assemblies to share a common clock pair or to operate with unique clock pairs to each memory assembly. The clock termination method is preferably selectable via a control signal (e.g., $V_{dd}$, $V_{ddQ}$ or ground pin on the memory assembly) to the memory assembly. For example, the invention enables a system that includes a control circuit to reduce power whereby clock termination is engaged during active periods, and disengaged during inactive periods.

It should be understood that the invention is not limited to any specific memory system or memory module configuration. The invention is especially useful in the context of DDR memory modules, more preferably a 168–200 pin DIMMs, however the invention can also be used with conventional SDRAM modules and with future advances in memory technology (e.g., future memory memories using such technologies as DDR II).

For low power, low pin count or high performance systems, the system of the invention would preferably disable the default clock termination (as described above), and implement any of several possible clocking solutions (based on the end-objectives). Examples of alternative termination/control methods include transition-controlled drivers at the chipset, with either series resistive termination or an R-C termination in parallel with each clock leg (the resistor being in series with the capacitor).

For high performance (e.g., DIMMs with clock re-drive), the memory system preferably further includes transition-controlled drivers at the source, with the same termination options described above. In addition, the clock would pass from the controller (or clock buffer) to each DIMM in series (each having a very short stub to the DIMM PLL device). This method would result in the clocks having approximately the same loading and delay as the address/control bus (which is also re-driven on DIMM), which will result in the address and clocks arriving at the DIMM at approximately the same time. This will provide the maximum possible address valid window to the DIMM, without having to delay the clock to the DIMM. The latter method is often used today, and has the drawback of delaying data being sent back to the controller—often resulting in an added clock of latency (a performance hit). Lastly, this method may further permit additional DIMMs to share the same address copy—reducing costs and pins on the memory controller.

This invention will permit memory modules to be developed that can operate in existing (emerging) memory subsystems, as well as meet the low power/low pin count needs of future memory subsystems—with no required changes to the existing/emerging systems. For 184 Pin Registered DIMMs, the power savings will equate to greater than 200 mw/DIMM, and systems will be permitted to connect DIMM clocks in serial, similar to address/control lines—thereby increasing the address/control window as well as the system read loop-back timings.

As noted previously, the invention is not limited to any specific memory module or memory system or end application.

What is claimed is:

1. A memory assembly having a plurality of pins on a connector interface for removably plugging said memory assembly into a memory system, said system providing a clock signal to said memory assembly on a clock signal input line coupled to at least one said pin of said connector interface, said memory assembly having an electrically selectable system-level clock termination adapted to selectably terminate said clock signal input line.

2. The memory assembly of claim 1 wherein said selectable clock termination is located at or near an end of a clock net.

3. The memory assembly of claim 1 wherein said clock termination is located at or near a split point of a clock net.

4. The memory assembly of claim 1 comprising a switch for enabling and/or disabling said clock termination.

5. The memory assembly of claim 4 wherein said switch is a FET switch.

6. The memory assembly of claim 5 wherein said FET switch is connected to an unused pin on the memory assembly.

7. The memory assembly of claim 5 further comprising a pullup or pulldown device to establish a normal operation mode selected from clock termination enabled and clock termination disabled.

8. The memory assembly of claim 7 further comprising a connection for an external signal for overriding said pulldown or pullup device.

9. The memory assembly of claim 6 wherein said FET switch is enabled or disabled via a connection to power or ground through said unused pin.

10. A memory system comprising the memory assembly of claim 9 further comprising a conventional power pin tied through a pullup or pulldown device to the opposing power rail.

11. The memory assembly of claim 1 wherein said assembly is operable in systems having both single drop end-terminated clock nets and systems having multi-drop clock nets wherein clock termination method is selected from the group consisting of (i) single end termination, (ii) source series termination, and (iii) source capacitive termination.

12. A memory controller that includes detection circuitry to determine the type of memory clock termination utilized on at least a clock signal line, such that a clock drive on said clock signal line is adjusted to match the detected termination method.

13. A memory system that includes:
   (a) a clock drive,
   (b) a memory controller that includes detection circuitry to determine the type of memory clock termination utilized, whereby said clock drive is adjusted to match the termination method, and
   (c) a memory assembly with a selectable system-level clock termination.

14. The system of claim 13, further including circuitry to reduce power by engaging clock termination during active periods and disengaging clock termination during inactive periods.

15. A memory module having a plurality of pins on a connector interface for removably plugging said memory module into a memory system, said system providing a clock signal to a plurality of said memory modules on a clock signal input line coupled to at least one pin of each said connector interface of respective said memory modules, said memory module having an electrically selectable clock termination adapted to selectably terminate said clock signal input line, said clock termination being selected in a manner permitting said memory module to share a common clock pair with other said memory modules or to operate with a unique clock pair to each said memory module.

16. The memory module of claim 15 wherein said clock termination method is selectable via a control signal through a pin of said connector interface of said memory assembly.

17. The memory module of claim 16 wherein said clock termination is selected by tying said pin to one of Vdd, Vddq or ground by leaving said pin unconnected at a next higher level of assembly.

18. The memory module of claim 17 wherein the default termination selection is a resistor across a differential pair.

19. The memory module of claim 15 wherein said module is a DDR memory module.

20. The memory module of claim 19 wherein said module is selected from the group consisting of a 184 pin DDR memory module and a 200 pin DDR memory module.

21. The memory module of claim 20 wherein said clock termination method is selectable via a previously unused pin on the memory assembly.

22. The memory module of claim 20 wherein said clock termination methods include a default termination selection of a resistor across a differential pair.

23. The memory module of claim 20 wherein said clock termination method is selected via use of a $V_{dd}$, $V_{ddQ}$ or ground pin on the memory assembly, whereby the termination method can be selected by tying said pin to one of the supplies identified or by leaving the pin unconnected at the next level of assembly.

24. The memory module of claim 15 wherein said clock termination methods comprise a switch on a memory assembly of said module, said switch enabling or disabling clock termination on said memory assembly.

25. The memory module of claim 24 wherein said switch is a FET switch.

26. The memory module of claim 25 wherein a FET switch is used to enable or disable each clock termination.

27. The memory module of claim 25 wherein the FET switch has a default active ('on') state wherein the termination is enabled.

28. A memory subsystem having an electrically selectable clock termination adapted to selectably terminate one or more clock signals which are input to a plurality of memory assemblies, each said memory assembly receiving said clock signal input over at least one pin of a multiple pin connector interface used to removably plug said memory assembly into said memory subsystem, said clock termination being selected in a manner permitting said memory assemblies to share a common clock signal or to operate with a unique clock signal to each said memory assembly.

29. The memory subsystem of claim 28 wherein a FET switch is integrated into a clock net of said subsystem to enable or disable clock termination on the memory assembly.

30. The memory subsystem of claim 29 wherein said FET switch includes an 'on-resistance' which is designed to provide the clock termination when the device is enabled.

31. The memory subsystem of claim 30 a FET switch is used to enable or disable each clock termination.

32. The memory subsystem of claim 30 wherein said FET switch is active ('on') as a default condition whereby termination is enabled.

* * * * *